United States Patent
Wang

(10) Patent No.: US 6,768,319 B2
(45) Date of Patent: Jul. 27, 2004

(54) ADAPTIVE COMPENSATION OF MEASUREMENT ERROR FOR INDUSTRIAL PROCESS CONTROL TRANSMITTERS

(75) Inventor: Rongtai Wang, Edina, MN (US)

(73) Assignee: Rosemount Inc., Eden Prairie, MN (US)

( * ) Notice: Subject to any disclaimer, the term of this patent is extended or adjusted under 35 U.S.C. 154(b) by 181 days.

(21) Appl. No.: 10/192,339

(22) Filed: Jul. 10, 2002

(65) Prior Publication Data

US 2004/0008040 A1 Jan. 15, 2004

(51) Int. Cl.$^7$ .............................................. G01R 27/26
(52) U.S. Cl. ..................................... 324/679; 324/678
(58) Field of Search ................................ 324/658, 662, 324/684, 686, 660, 676–678, 607, 608, 679, 680

(56) References Cited

U.S. PATENT DOCUMENTS

| | | | | |
|---|---|---|---|---|
| 4,054,833 A | * | 10/1977 | Briefer | 324/679 |
| 4,636,714 A | * | 1/1987 | Allen | 324/678 |
| 6,316,948 B1 | * | 11/2001 | Briefer | 324/678 |
| 6,377,056 B1 | * | 4/2002 | Hanzawa et al. | 324/678 |

* cited by examiner

Primary Examiner—Minh H Chau

(74) Attorney, Agent, or Firm—Westman, Champlin & Kelly

(57) ABSTRACT

Error in a process variable measurement due to leakage conductance in an industrial process control transmitter is compensated by identifying capacitance deviations $\delta C_H$ and $\delta C_L$ based on leakage conductance for each of the capacitive sensors. Error expressions are derived as $$\varepsilon_1 = \eta_m \frac{\delta C_H + \delta C_L}{C_H + C_L}$$

and $$\varepsilon_2 = \frac{\delta C_H - \delta C_L}{C_H + C_L},$$

where $\eta_m$ is the measured capacitance ratio based on $$\frac{C_H - C_L}{C_H + C_L}.$$

The corrected process variable measurement is calculated as $\eta_m + \varepsilon_1 - \varepsilon_2$. A look-up table is employed in some embodiments to correlate the capacitance deviations to sample frequency and/or measured leakage conductance. Application of the technique to sensors employing offset capacitors that compensate for offset of the capacitive sensors is also described.

21 Claims, 4 Drawing Sheets

ADAPTIVE COMPENSATION OF MEASUREMENT ERROR FOR INDUSTRIAL PROCESS CONTROL TRANSMITTERS

FIELD OF THE INVENTION

This invention relates to capacitive pressure sensors for use in industrial process control systems, and particularly to compensation of measurement error due to leakage conductance in such sensors.

BACKGROUND OF THE INVENTION

Certain industrial process control transmitters employ capacitive pressure sensors and measurement circuits that measure industrial process variables. The measurement circuit includes a sigma-delta charge-to-digital converter and a processor that supplies the measurement value of the process variable for transmission to a central control station. In some embodiments, the sensor includes a metal diaphragm that serves as a common electrode for a differential pair of capacitive sensors. Different portions of the process variable are applied to opposite sides of the diaphragm to deflect the diaphragm based on the process variable. The capacitive sensors are charged by an input voltage, and the charge is transferred to the measurement circuit to derive the digital representation of the value of the process variable.

The sigma-delta circuit integrates the charges to increase or decrease an output signal over a number of sample cycles. The ratio of the number of steps of increase or decrease to the total number of samples represents the process variable value.

One problem with sensors of the class describe above is that leakage conductance generates measurement errors. Two common sources of leakage conductance include conductance across the sensor capacitor terminals, such as through a dielectric fill material (e.g., oil), and residual moisture on the circuit board forming the measurement circuit. Experiments reveal that a leakage resistance of about 1 gigaOhm (conductance as small as about 1 nanoSiemen) degrades the accuracy of a 16-bit digital signal to about 13 bits. Even where the excitation of the capacitive sensor is symmetric, the finite leakage still causes significant measurement error.

SUMMARY OF THE INVENTION

The present invention is directed to adaptive compensation of measurement error in industrial process control transmitters by which the process variable measurement value is corrected for error due to leakage based on the measured capacitance and leakage conductance of the sensor.

In one embodiment of the invention, an industrial process control transmitter is operated to compensate for errors in a process variable measurement due to leakage conductance in the transmitter. The industrial process control transmitter includes first and second capacitive sensors that sense the process variable and a measurement circuit coupled to the sensors that provides the process variable measurement based on ratio of the capacitance, e.g., $$\frac{C_H - C_L}{C_H + C_L}$$

where $C_H$ and $C_L$ are the first and second capacitors. A leakage conductance is measured for each of the first and second sensors. The process variable measurement is derived from the capacitance ratio and leakage conductances.

In preferred embodiments, first and second capacitance deviations, $\delta C_H$ and $\delta C_L$, are identified for each of the first and second sensors based on the measured leakage conductance. First and second error expressions are derived based on ratios of the capacitance deviations to the total capacitance of the sensor. The process variable measurement is derived from the measured capacitance ratio and the first and second error expressions.

In some embodiments, the first error expression is $$\varepsilon_1 = \eta_m \frac{\delta C_H + \delta C_L}{C_H + C_L},$$

and the second error expression is $$\varepsilon_2 = \frac{\delta C_H - \delta C_L}{C_H + C_L},$$

where $\eta_m$ is the measured capacitance ratio, and the corrected process variable measurement is calculated as $\eta_m + \varepsilon_1 - \varepsilon_2$.

In some embodiments the values for the capacitance deviations are calculated during manufacture and stored in the processor for calculation of the corrected measurement. In other embodiments, the processor includes a look-up table that contains values of the deviation capacitances based on various sample frequencies and/or measured conductance of the sensor.

DETAILED DESCRIPTION OF THE PREFERRED EMBODIMENTS

1. Circuit Model.

Figure 1:
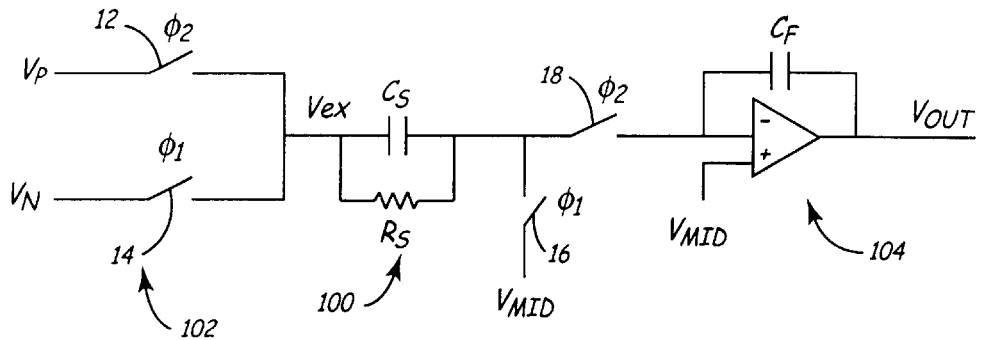
FIGS. 1–5 are circuit diagrams and accompanying waveforms useful in explaining the principles of the present invention.

FIG. 1 is a circuit diagram illustrating a sensor 100, charge circuit 102 and first stage of an integrator circuit 104 employed in an industrial process control transmitter. Sensor 100 includes a capacitive sensor $C_S$ coupled between differential amplifier 10 of a first-stage sigma-delta (Σ-Δ) integrator 104 and the charge circuit 102 that includes a source of excitation voltage $V_P$ and $V_N$. Switches 12 and 14 couple sources $V_P$ and $V_N$ to an input side of sensor capacitor $C_S$. The opposite side of capacitor $C_S$ is selectively coupled through switch 16 to voltage $V_{mid}$, selected halfway between voltages $V_P$ and $V_N$, and through switch 18 to the negative input of differential amplifier 10. Switches 12, 14, 16 and 18 are operated to conductive and non-conductive states during non-overlapping phases $\Phi_1$ and $\Phi_2$.

The circuit operates in a positive and a negative excitation mode. For the positive excitation mode, during phase $\Phi_1$, voltage source $V_N$ is coupled through switch 14 to the input of capacitive sensor $C_S$ and the output of capacitive sensor $C_S$ is coupled to $V_{mid}$ through switch 16. During phase $\Phi_2$, voltage source $V_P$ is coupled through switch 12 to the input of sensor $C_S$ and the output of sensor $C_S$ is coupled through switch 18 to the negative input of differential amplifier 10. For the negative excitation mode, during phase $\Phi_1$, voltage source $V_P$ is coupled through switch 12 to the input of capacitive sensor $C_S$ and the output of capacitive sensor $C_S$ is coupled to $V_{mid}$ through switch 16. During phase $\Phi_2$, voltage source $V_N$ is coupled through switch 14 to the input of sensor $C_S$ and the output of sensor $C_S$ is coupled through switch 18 to the negative input of differential amplifier 10. Integrator feedback capacitor $C_F$ is coupled between the output and negative input of amplifier 10.

In the case of positive excitation, the excitation voltage $V_{ex}$ jumps from the low level $V_N$ to the high level $V_P$, whereas for case of negative excitation, the sensor excitation voltage $V_{ex}$ jumps from the high level $V_P$ to the low level $V_N$.

If the leakage conductance is zero (ideal conditions), the voltage step created in the integrator output for each sample during the positive excitation mode is $$\Delta V = -V_{ex}\frac{C_S}{C_F}$$

and the voltage step created in the integrator output for each sample during the negative excitation mode is $$\Delta V = V_{ex}\frac{C_S}{C_F},$$

where $V_{ex}$ is the magnitude of the excitation voltage. If the leakage conductance is not zero, current will flow from $V_P$ through switch 12, the sensor leakage resistance $R_S$, and switch 18 to amplifier 10. The magnitude of this leakage current is $V_P/R_S$, where $V_P$ is the voltage difference between input voltage $V_P$ and the voltage $V_{mid}$. If the settling time for the integrator is negligible or small compared to the integrator duration $\tau$, then the total charge leaked from source $V_P$ into the integrator is approximated as $\tau V_P/R_S$. The integrator duration $\tau$ is based on the sample frequency (e.g., $$\tau = \frac{1}{2}\frac{1}{f_S},$$

where $f_S$ is the sample frequency). This leaked charge generates an additional voltage deviation in the integrator output, which is expressed as $$\delta V = -\frac{V_P\tau}{R_S C_F}.$$

Therefore, the effective voltage step for the positive excitation case is expressed as $$\delta V_{eff} = -\frac{V_{ex}}{C_F}(C_S + \delta C_S),$$

where the second term, $\delta C_S$, contributed by non-zero leakage conductance, can be expressed as $$\delta C_S = \frac{V_P}{V_{ex}}\frac{\tau}{R_S}.$$

A similar analysis can be applied for the negative excii3ation case, resulting in an effective voltage step expressed as $$\delta V_{eff} = \frac{V_{ex}}{C_F}(C_S + \delta C_S),$$

where the second term, $\delta C_S$, introduced by non-zero leakage conductance, can be expressed as $$\delta C_S = \frac{V_N}{V_{ex}}\frac{\tau}{R_S}$$

and $V_N$ is the voltage difference between node $V_{mid}$ and input voltage $V_N$. As in the case of phase $\Phi_1$, $V_{mid}$ may be ground or zero voltage and $V_P$ and $V_N$ symmetrical about ground as positive and negative voltages.

Figures 2, 3:
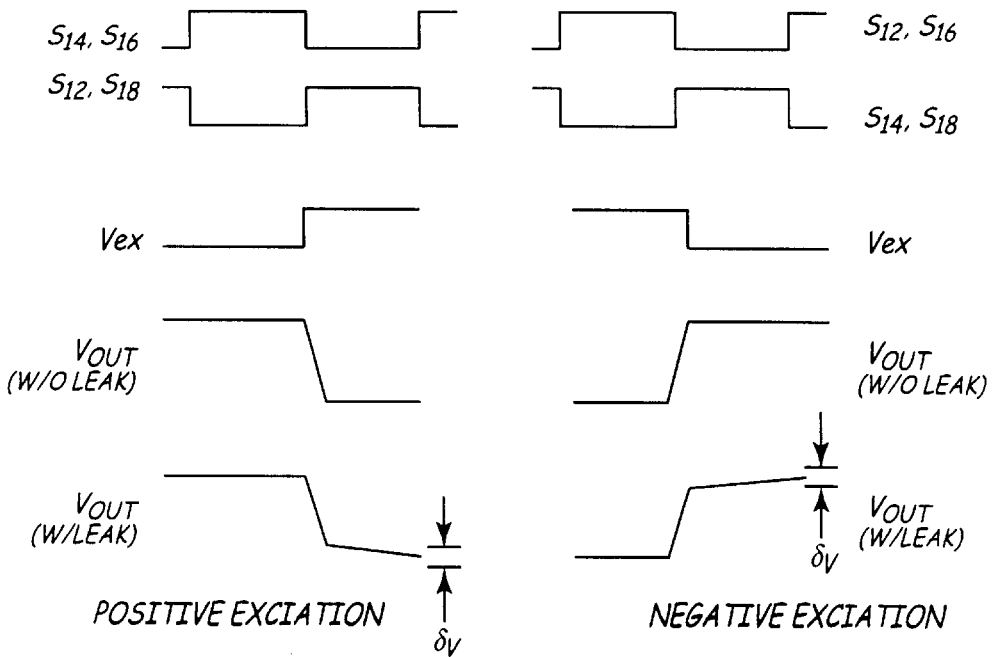

FIGS. 2 and 3 illustrate waveforms demonstrating the effect of non-zero leakage conductance in the sensor. As shown in FIGS. 2 and 3, the output voltage may deviate by $\delta V$ due to leakage conductance. In both the positive and negative excitation cases, the effect of leakage conductance is equivalent to a deviation of the sensor capacitive value $\delta C_S$.

The equivalent capacitance deviation changes with the operating frequency of the sensor. For example, if the operating frequency is 25 kHz, the sampling period is 40 μsec and the integration duration, $\tau$, is 20 μsec. Table 1 identifies the equivalent capacitive deviation due to leakage for various leakage conductances.

TABLE 1

Equivalent Capacitance Deviation at 25 kHz

| $G_s$ (1/Ω) | $\delta C_s$ (pF) |
|---|---|
| $10^{-9}$ | 0.01 |
| $10^{-8}$ | 0.1 |
| $10^{-7}$ | 1.0 |
| $10^{-6}$ | 10.0 |

Table 2 illustrates the equivalent capacitance deviation for various leakage conductances where the operating frequency is 62.5 kHz, the sampling period is 16 μsec and the integration duration, $\tau$, is 8 μsec.

TABLE 2

Equivalent Capacitance Deviation at 62.5 kHz

| $G_s$ (1/Ω) | $\delta C_s$ (pF) |
|---|---|
| $10^{-9}$ | 0.004 |
| $10^{-8}$ | 0.04 |
| $10^{-7}$ | 0.4 |
| $10^{-6}$ | 4.0 |

2. Measurement Error.

In the case of an industrial process control transmitter having a differential sensor employing high-side $C_S$ and low-side $C_L$ capacitive sensors, both sensors can be operated using the same symmetrical excitation voltages.

Figure 4:
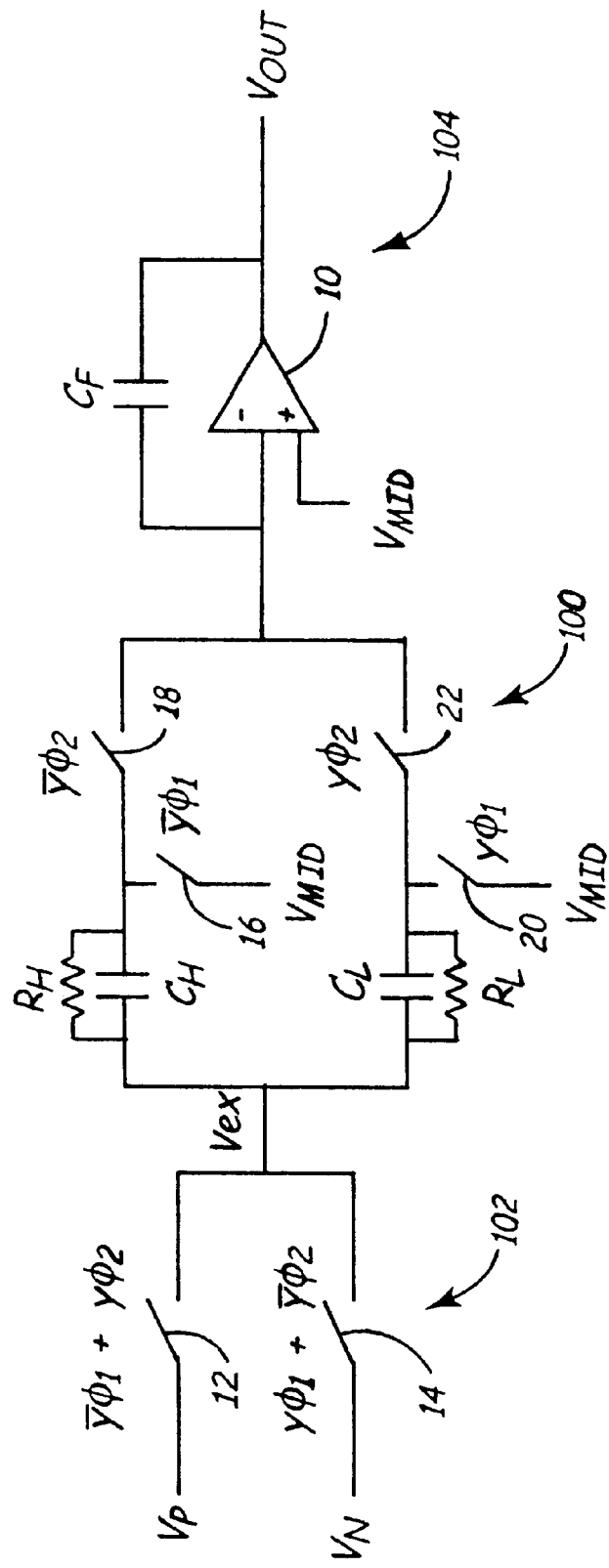

FIG. 4 illustrates a simplified circuit diagram of the sensor 100, charge circuit 102 and a first stage of an integrator circuit 104 for an industrial process control transmitter employing a differential pressure sensor. The circuit operates similar to that of FIG. 1, except there are separate differentially-operated capacitive sensors measuring the high-side ($C_H$) and low-side ($C_L$) of the process variable. In this case, $\Phi_1$ and $\Phi_2$ represent non-overlapping phase signals, and y and $\bar{y}$ are complimentary signals representing whether the circuit is operating in the positive or negative excitation mode at the particular sampling period. Thus, during the positive excitation mode of the circuit (y is high), input voltage $V_N$ is coupled through switch 14 during phase $\Phi_1$ to the input side of low-side sensor $C_L$, and the output side is coupled to $V_{mid}$ through switch 20. During phase $\Phi_2$ input voltage $V_P$ is supplied to the input side of low-side sensor $C_L$ and the output side is coupled through switch 22 to the negative input of differential amplifier 10. In a similar manner during the negative excitation mode of the circuit ($\bar{y}$ is high), during phase $\Phi_1$ the input of high-side sensor $C_H$ is coupled through switch 12 to input voltage $V_P$ and the output of high-side capacitor is coupled through switch 16 to voltage $V_{mid}$. During phase $\Phi_2$ the input of high-side capacitor $C_H$ is coupled through switch 14 to $V_N$ and the output of high-side capacitor $C_H$ is coupled through switch 18 to the negative input of differential amplifier 10. The process variable under measurement by the circuit illustrated in FIG. 4 is, in the ideal situation without leakage conductance, expressed as a capacitance ratio $$\eta_0 = \frac{C_H - C_L}{C_H + C_L}. \quad (1)$$

However, non-zero leakage conductance affects the actual capacitance ratio. Consequently, the actual (measured) capacitance ratio is $$\eta_m = \frac{(C_H + \delta C_H) - (C_L + \delta C_L)}{(C_H + \delta C_H) + (C_L + \delta C_L)}, \quad (2)$$

where $\delta C_H$ is the equivalent capacitance deviation of the high-side capacitance $C_H$ due to high-side leakage conductance and $\delta C_L$ is the equivalent capacitive deviation of low-side capacitor $C_L$ due to low-side leakage conductance. The measurement error of the circuit illustrated in FIG. 4 is expressed as $$\varepsilon = \eta_m - \eta_0 = \frac{(C_H + \delta C_H) - (C_L + \delta C_L)}{(C_H + \delta C_H) + (C_L + \delta C_L)} - \frac{C_H - C_L}{C_H + C_L}. \quad (3)$$

The equivalent capacitance deviation and measurement errors can be calculated from the measured leakage conductance across the sensor capacitors. Tables 3, 4 and 5 set forth three examples of capacitive deviations and the corresponding measurement errors induced by leakage conductance and also identifies the measurement error $\Delta N$ in the digital count, based on a normalization count of $N=2^{16}$. In each case, modulation frequency of a second order capacitance-to-digital modulator is assumed to be 25 kHz. The leakage conductance varies between $10^{-7}$ and $10^{-9}$ siemens as set forth in Table 1. In the example given in Table 3, the high-side capacitance $G_H$ and the low-side capacitance $C_L$ are both 50 pF and the capacitance ratio under measurement is 0 ($\eta_0=0$), representing a zero differential capacitance.

TABLE 3

Leakage induced measurement error

| $\delta C_H$ (pF) | $\delta C_L$ (pF) | $\eta_m$ | $\epsilon$ | $\Delta N$ |
|---|---|---|---|---|
| 0 | 0 | 0.0 | 0 | 0 |
| 0.01 | 0 | 0.00010 | 0.00010 | 7 |
| 0.1 | 0 | 0.00100 | 0.00100 | 65 |
| 1.0 | 0 | 0.00990 | 0.00990 | 649 |

TABLE 3-continued

Leakage induced measurement error

| $\delta C_H$ (pF) | $\delta C_L$ (pF) | $\eta_m$ | $\epsilon$ | $\Delta N$ |
|---|---|---|---|---|
| 0 | 0.01 | −0.00010 | −0.00010 | −7 |
| 0 | 0.1 | −0.00100 | −0.00100 | −65 |
| 0 | 1.0 | −0.00990 | −0.00990 | −649 |

$C_H = 50$ pF,
$C_L = 50$ pF,
$\eta_0 = 0$

In a second example, set forth in Table 4, the circuit is operated in a non-zero differential input ($\eta_0=0.5$), the high-side capacitance is $C_H=75$ pF and the low-side capacitance is $C_L=25$ pF.

TABLE 4

Leakage induced measurement error

| $\delta C_H$ (pF) | $\delta C_L$ (pF) | $\eta_m$ | $\epsilon$ | $\Delta N$ |
|---|---|---|---|---|
| 0 | 0 | 0.5 | 0 | 0 |
| 0.01 | 0 | 0.50005 | 0.00005 | 3 |
| 0.1 | 0 | 0.50050 | 0.00050 | 33 |
| 1.0 | 0 | 0.50495 | 0.00495 | 324 |
| 0 | 0.01 | 0.49985 | −0.00015 | −10 |
| 0 | 0.1 | 0.49850 | −0.00150 | −98 |
| 0 | 1.0 | 0.48515 | −0.01485 | −973 |

$C_H = 75$ pF,
$C_L = 25$ pF,
$\eta_0 = 0.5$

In another non-zero differential input example ($\eta_0=-0.5$), the high-side capacitor is $C_H=25$ pF and the low-side capacitance is $C_L=75$ pF and the results set forth in Table 5.

TABLE 5

Leakage induced measurement error

| $\delta C_H$ (pF) | $\delta C_L$ (pF) | $\eta_m$ | $\epsilon$ | $\Delta N$ |
|---|---|---|---|---|
| 0 | 0 | −0.5 | 0 | 0 |
| 0.01 | 0 | −0.49985 | 0.00015 | 10 |
| 0.1 | 0 | −0.49850 | 0.00150 | 98 |
| 1.0 | 0 | −0.48515 | 0.01485 | 973 |
| 0 | 0.01 | −0.50005 | −0.00005 | −3 |
| 0 | 0.1 | −0.50050 | −0.00050 | −33 |
| 0 | 1.0 | −0.50495 | −0.00495 | −324 |

$C_H = 25$ pF,
$C_L = 75$ pF,
$\eta_0 = -0.5$

As demonstrated by the tabulated results, the error in the count, $\Delta N$, due to leakage conductance can be as much as 973 counts in $2^{16}$ total counts (N). This represents an error of as much as 1.5% in the measurement value.

Figure 5:
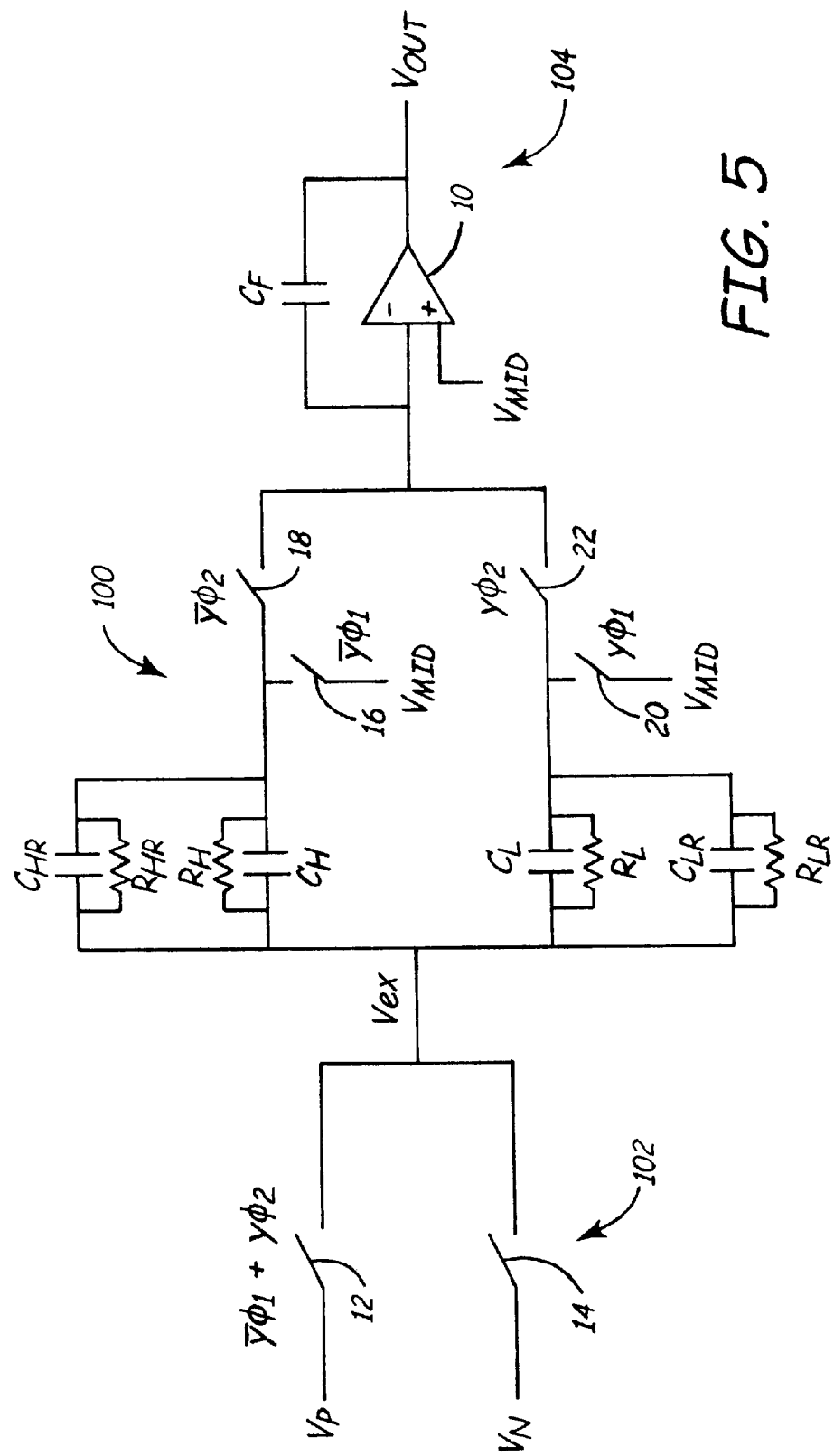

FIG. 5 illustrates sensor 100, charge circuit 102 and first integrator stage 104 of an industrial process control transmitter incorporating a capacitance sensor having offset compensation capacitors as described in U.S. Pat. No. 6,295,875 granted Oct. 2, 2001 to Frick et al. for "Process Pressure Measurement Devices with Improved Error Compensation" and assigned to the same Assignee as the present invention. The sensor described in the Frick et al. patent employs offset capacitors that are subject to the same process variables as the corresponding principal capacitive sensors. The offset capacitors, which are in the form of rings, provide compensation due to offset of the principal capacitive sensors. More particularly, separate offset capacitors $C_{HR}$ and $C_{LR}$ provide compensation for offset of the corresponding principal capacitor $C_H$ and $C_L$, respectively. The process variable measurement is given by the capacitance ratio expression:

$$\tilde{\eta}_0 \approx \frac{\tilde{C}_H - \tilde{C}_L}{\tilde{C}_H + \tilde{C}_L}, \tag{4}$$

where $\tilde{C}_H$ and $\tilde{C}_L$ are the total capacitance of the high-side and low-side principal capacitive sensors such that $\tilde{C}_H = C_H - k_H C_{HR}$ and $\tilde{C}_L = C_L - k_L C_{LR}$, and $k_H$ and $k_L$ are gain factors associated with the corresponding offset capacitor $C_{HR}$ and $C_{LR}$. Typically, the gain factors $k_H$ and $k_L$ are within the dynamic range of about 0.39 to 0.55. Non-zero leakage conductance may exist across both the principal capacitive sensors as well as the offset ring capacitors. Consequently, the actual capacitance ratio measurement is $$\tilde{\eta}_m = \frac{(\tilde{C}_H + \delta\tilde{C}_H) - (\tilde{C}_L + \delta\tilde{C}_L)}{(\tilde{C}_H + \delta\tilde{C}_H) + (\tilde{C}_L + \delta\tilde{C}_L)}, \tag{5}$$

where the equivalent capacitance deviations $\delta\tilde{C}_H$ and $\delta\tilde{C}_L$ for the high-side and low-side sensors can be expressed as $\delta\tilde{C}_H = \delta C_H - k_H \delta C_{HR}$ and $\delta\tilde{C}_L = \delta C_L - k_L \delta C_{LR}$, and where $\delta C_H$ and $\delta C_L$ are the equivalent capacitive deviations of the principal capacitive sensors induced by leakage and $\delta C_{HR}$ and $\delta C_{LR}$ are the equivalent capacitive deviations of the offset capacitors induced by leakage. Consequently, the measurement error is $$\tilde{\varepsilon} = \tilde{\eta}_m - \tilde{\eta}_0 = \frac{(\tilde{C}_H + \delta\tilde{C}_H) - (\tilde{C}_L + \delta\tilde{C}_L)}{(\tilde{C}_H + \delta\tilde{C}_H) + (\tilde{C}_L + \delta\tilde{C}_L)} - \frac{\tilde{C}_H - \tilde{C}_L}{\tilde{C}_H + \tilde{C}_L}. \tag{6}$$

Similar to the case of FIG. 4, the equivalent capacitive deviation and measurement errors of the sensor with offset capacitors can be calculated from the measured leakage conductance across the ring capacitors and the principal capacitive sensors.

The direction of the capacitive shift caused by leakage can be positive or negative. For example, the normalized equivalent capacitance deviation for the high-side capacitor is $\delta\tilde{C}_H = (1-k_H\beta_H)\hat{V}_x G_H \tau$ where $\beta_H = G_{HR}/G_H$, the high-side principal capacitive sensor leakage conductance is $G_H$, and the high-side offset capacitor leakage conductance is $G_{HR}$. There are three possible conditions: If $k_H\beta_H=1$, then $\delta\tilde{C}_H=0$ and the active capacitance shift caused by the principal sensor leakage conductance is cancelled by that of the offset leakage conductance. If $k_H\beta_H>1$, then $\delta\tilde{C}_H<0$ and the high-side active capacitance shift caused by leakage conductance is negative. If $k_H\beta_H<1$, then $\delta\tilde{C}_H>0$ and the high-side active capacitance shift caused by leakage conductance is positive. Similar conditions exist for the low-side sensor.

3. Adaptive Compensation Algorithm.

In the case of the circuit illustrated in FIG. 4, the leakage conductance is very small, so the effective capacitive deviation caused by leakage conductance is small compared to the sensor capacitance. Consequently, $\delta C_H \ll C_H$ and $\delta C_L \ll C_L$. Using a first order approximation, the error calculation can be expressed as follows:

$$\varepsilon = \eta_m - \eta_0 \approx \frac{\delta C_H - \delta C_L}{C_H + C_L} - \eta_0 \frac{\delta C_H + \delta C_L}{C_H + C_L}. \tag{7}$$

Consequently a compensated measurement equation can be derived based on the error expression of equation (7):

$$\eta_{mc} \approx \eta_m + \varepsilon_1 - \varepsilon_2, \tag{8}$$

where $\varepsilon_1$ and $\varepsilon_2$ are $$\varepsilon_1 = \eta_m \frac{\delta C_H + \delta C_L}{C_H + C_L} \text{ and } \varepsilon_2 = \frac{\delta C_H - \delta C_L}{C_H + C_L}. \tag{9}$$

Hence, the process variable measurement can be expressed as $$\eta_0 = \frac{C_H - C_L}{C_H + C_L} \approx \eta_{mc}, \tag{10}$$

and is approximately equal to the measured capacitance ratio adjusted for the two error expressions, $\varepsilon_1 - \varepsilon_2$.

The inputs to the compensated measurement algorithm are (1) the measured capacitance ratio $\eta_m$, (2) the total sensor capacitances, $C_H + C_L$, and (3) the measured leakage conductances $G_H$ and $G_L$. The algorithm calculates the equivalent capacitance deviations $\delta C_H$ and $\delta C_L$, as well as error calculations $\varepsilon_1$ and $\varepsilon_2$ and $\varepsilon = \varepsilon_2 - \varepsilon_1$. The output of the algorithm is the compensated capacitance ratio $\eta_{mc} \approx \eta_m + \varepsilon_1 - \varepsilon_2$.

Tables 6, 7 and 8 set forth three examples of application of the compensation algorithm to the sensor illustrated in FIG. 4; these examples parallel those set forth in Tables 3, 4 and 5, respectively. Table 3 sets forth the results of the case of a zero differential process variable having the same parameters employed in the example of Table 3. The sample frequency is 25 kHz, $C_H = 50$ pF, $C_L = 50$ pF and leakage conductance is between $10^{-7}$ and $10^{-9}$ siemens, depending on capacitance deviation. The measured capacitance ratio $\eta_m$ and the calculated error terms $\varepsilon_1$ and $\varepsilon_2$ are identified. The compensated capacitor ratio $\eta_{mc}$ is derived from $\eta_m + \varepsilon_1 - \varepsilon_2$.

TABLE 6

Compensated Capacitive Ratio

| $\eta_m$ | $\delta C_H$ (pF) | $\delta C_L$ (pF) | $\varepsilon_1$ | $\varepsilon_2$ | $\eta_{mc} = \eta_m + \varepsilon_1 - \varepsilon_2$ |
|---|---|---|---|---|---|
| 0.00010 | 0.01 | 0 | 0 | 0.00010 | 0.0 |
| 0.00100 | 0.1 | 0 | 0 | 0.00100 | 0.0 |
| 0.00990 | 1.0 | 0 | 0.00010 | 0.01000 | 0.0 |
| −0.00010 | 0 | 0.01 | 0 | −0.00010 | 0.0 |
| −0.00100 | 0 | 0.1 | 0 | −0.00100 | 0.0 |
| −0.00990 | 0 | 1.0 | −0.00010 | −0.01000 | 0.0 |

$C_H = 50$ pF,
$C_L = 50$ pF,
$\eta_0 = 0$

It will be appreciated that in the example set forth in Table 6 the compensated capacitance ratio is equal to the base capacitance ratio for each value of measured capacitance ratio. Consequently, the measurement error in the digital count is zero ($\Delta N=0$) in each case. Comparing this result to that set forth in Table 3, the compensated output of the measurement circuit according to the present invention is a more accurate measure of the process variable.

Similarly, Table 7 sets forth the case of a non-zero differential variable where $C_H$ and $C_L$ are 75 pH and 25 pF, respectively, and the base capacitance ratio $\eta_O$ is 0.5, using the same parameters as the example of Table 4. The calculated error terms $\epsilon_1$ and $\epsilon_2$ and compensated capacitance ratio $\eta_{mc}=\eta_m+\epsilon_1-\epsilon_2$ and identified.

TABLE 7

Measurement Error Compensation

| $\eta_m$ | $\delta C_H$ (pF) | $\delta C_L$ (pF) | $\epsilon_1$ | $\epsilon_2$ | $\eta_{mc} = \eta_m + \epsilon_1 - \epsilon_2$ |
|---|---|---|---|---|---|
| 0.50005 | 0.01 | 0 | 0.00005 | 0.00010 | 0.50000 |
| 0.50050 | 0.1 | 0 | 0.00050 | 0.00100 | 0.50000 |
| 0.50495 | 1.0 | 0 | 0.00505 | 0.01000 | 0.50000 |
| 0.49985 | 0 | 0.01 | 0.00005 | −0.00010 | 0.50000 |
| 0.49850 | 0 | 0.1 | 0.00050 | −0.00100 | 0.50000 |
| 0.48515 | 0 | 1.0 | 0.00485 | −0.01000 | 0.50000 |

$C_H$ = 75 pF,
$C_L$ = 25 pF,
$\eta_0$ = 0.5

The compensated capacitance ratio $\eta_{mc}$ is equal to the base capacitance ratio $\eta_0$, so $\Delta N=0$.

Table 8 tabulates the case of a non-zero differential pressure where the base capacitance ratio $\eta_0$ is −0.5, using the same parameters set forth above where $\delta C_H$ and $\delta C_L$ are the equivalent capacitance deviations caused by leakage (see Table 5). The error terms $\epsilon_1$, $\epsilon_2$ from which compensated measurement result $\eta_{mc}$ are tabulated in Table 8.

TABLE 8

Measurement Error Compensation

| $\eta_m$ | $\delta C_H$ (pF) | $\delta C_L$ (pF) | $\epsilon_1$ | $\epsilon_2$ | $\eta_{mc} = \eta_m + \delta_1 - \delta_2$ |
|---|---|---|---|---|---|
| −0.49985 | 0.01 | 0 | −0.00005 | 0.00010 | −0.50000 |
| −0.49850 | 0.1 | 0 | −0.00050 | 0.00100 | −0.50000 |
| −0.48515 | 1.0 | 0 | −0.00485 | 0.01000 | −0.50000 |
| −0.50005 | 0 | 0.01 | −0.00005 | −0.00010 | −0.50000 |
| −0.50050 | 0 | 0.1 | −0.00050 | −0.00100 | −0.50000 |
| −0.50495 | 0 | 1.0 | −0.00505 | −0.01000 | −0.50000 |

$C_H$ = 25 pF,
$C_L$ = 75 pF,
$\eta_0$ = −0.5

It will be appreciated from a comparison of the results of Tables 6–8 to Tables 3–5 that the compensated output of the measurement circuit employing the techniques of the present invention is a more accurate measure of the process variable than achieved without the compensation technique. Thus, where prior techniques resulted in errors as great as 973 counts in $2^{16}$ (about 1.5%), the present invention results in greatly reduced measurement errors.

Similar results can be obtained with sensors of the type shown in FIG. 5. A first order approximation of the error calculation of equation 7 can be rewritten as $$\tilde{\varepsilon} = \tilde{\eta}_m - \tilde{\eta}_o \approx \frac{\delta\tilde{C}_H - \delta\tilde{C}_L}{\tilde{C} + \tilde{C}_L} - \tilde{\eta}_o \frac{\delta\tilde{C}_H + \delta\tilde{C}_L}{\tilde{C}_H + \tilde{C}_L}. \quad (10)$$

The compensation equation is derived as $$\eta_{mc} \approx \eta_m + \epsilon_1 - \epsilon_2. \quad (11)$$

The error functions $\epsilon_1$ and $\epsilon_2$ can be calculated as $$\tilde{\varepsilon}_1 = \tilde{\eta}_m \frac{\delta\tilde{C}_H + \delta\tilde{C}_L}{\tilde{C}_H + \tilde{C}_L} \text{ and } \tilde{\varepsilon}_2 = \frac{\delta\tilde{C}_H - \delta\tilde{C}_L}{\tilde{C}_H + \tilde{C}_L}. \quad (12)$$

The inputs for the compensation algorithm are the measured capacitance ratio $\eta_m$, the total estimated active sensor capacitance $\tilde{C}_H+\tilde{C}_L$ and the measured leakage conductances $G_H$, $G_{HR}$, $G_L$ and $G_{LR}$. The equivalent capacitance deviations $\delta\tilde{C}_H$, $\delta\tilde{C}_{HR}$, $\delta\tilde{C}_L$ and $\delta\tilde{C}_{LR}$ and the error values $\epsilon_1$, $\epsilon_2$ and $\epsilon$ are intermediate calculations of the algorithm, and the compensated reading of $\eta_{mc} \approx \eta_m + \epsilon_1 - \epsilon_2$ output of the algorithm is obtained.

4. Implementation.

Figure 6:
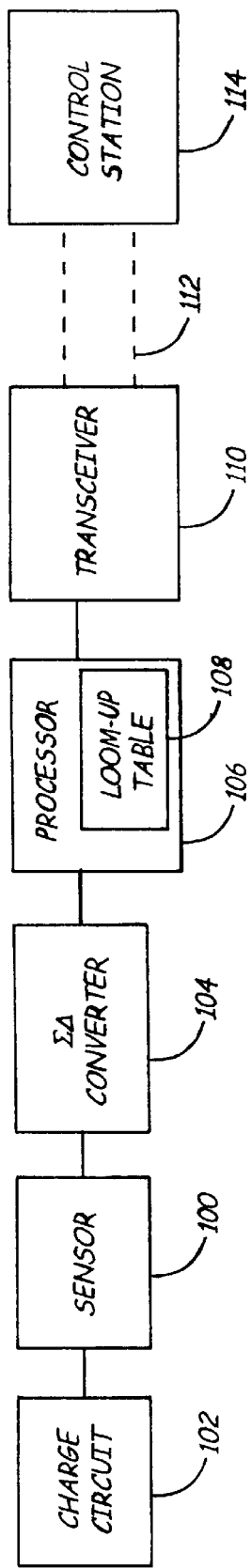
FIG. 6 is a block diagram illustrating an industrial process control transmitter employing the present invention.

FIG. 6 is a block diagram of an industrial process control transmitter in which the present invention is useful. The industrial process control transmitter includes sensor 100, charge circuit 102, $\Sigma$-$\Delta$ converter 104 as herein described operating processor 106 that includes look-up table 108 to supply measurement data to transceiver 110. Communication link 112 couples the transceiver of the industrial process control transmitter to central control station 114. For example, communication link 112 may be a two-wire loop that supplies power and control signals from the control station to the transmitter and supplies data to the control station from the transmitter. One well-known two-wire link is a 4–20 mA loop operating in a digital or analog mode (or both).

In one embodiment of the transmitter, the leakage conductance of each sensor capacitor is measured during manufacture of the transmitter, such as during final inspection in the factory. The capacitance deviation, $\delta C$, is calculated and stored in processor 106. More particularly, for the symmetrical differential sensor exemplified in FIG. 4, the leakage conductance, $G_H$ and $G_L$, is measured for the high-side and low-side capacitors $C_H$ and $C_L$, respectively, and the high-side and low-side capacitance deviations, $\delta C_H$ and $\delta C_L$, are calculated from $$\delta C_H = G_H \tau \frac{V_P}{V_{ex}}$$

and $$\delta C_L = G_L \tau \frac{V_N}{V_{ex}},$$

where $V_{ex}=V_P-V_N$, $V_P$ is the voltage difference between the node $V_P$ and the node $V_{mid}$, $V_N$ is the voltage difference between the node $V_N$ and the node $V_{mid}$, $\tau$ is the integration time and $C_F$ is the capacitance of the feedback capacitor. Therefore the values of the capacitance deviations, $\delta C_H$ and $\delta C_L$, can be calculated at the final inspection and stored in look-up table 108 of processor 106. If the transmitter is designed to operate at various sample frequencies, such as 25 kHz and 62.5 kHz, the values of the capacitance deviations, $\delta C_H$ and $\delta C_L$, can be stored in look-up table 108 and retrieved for use by the processor on the basis of the sample frequency.

In other embodiments, the conductance of the sensor might be measured in situ, such as by applying a test voltage to the capacitive sensors during a start-up mode, or during a periodic interruption of sensor operation, to measure the leakage current, thus obtaining the leakage conductance. In this case, table 108 contains a table of values of the capacitance deviations for various values of leakage conductance (or current) and values of sampling frequency, as applicable. The measured conductance (and operating sample frequency, if applicable) is used to look up values of capacitance deviation for correction of the measurement.

The capacitance deviations for the symmetrical differential sensor exemplified in FIG. 5 are identified in a similar manner. In this case, however, the leakage conductances, $\tilde{G}_H$ and $\tilde{G}_L$, include the conductance due to the offset capacitors associated with the high-side and low-side capacitors $C_H$ and $C_L$, so the capacitance deviations can be calculated from $$\delta \tilde{C}_H = \tilde{G}_H \tau \frac{V_P}{V_{ex}}$$

and $$\delta \tilde{C}_L = \tilde{G}_L \tau \frac{V_N}{V_{ex}}.$$

In any case, processor 106 calculates the error values $\epsilon_1$ and $\epsilon_2$ using the retrieved values of high-side and low-side capacitance deviations, the total (rated) capacitance of the sensor and the measured ratio $\eta_m$. The output measurement is the compensated measurement $\eta_{mc}=\eta_m+\epsilon_1-\epsilon_2$.

The present invention thus provides a simple and effective technique for correction of errors in measurement output values due to leakage conductance in industrial process control transmitters. As a result, output values provide a more accurate measurement of process variables than can be achieved without the correction technique. The technique can be programmed into the processor using values established at the time of manufacture of the transmitter, or the values may be stored in a look-up table for the processor's use based on variations in sample frequency and/or leakage conductance of the transmitter.

Although the present invention has been described with reference to preferred embodiments, workers skilled in the art will recognize that changes may be made in form and detail without departing from the spirit and scope of the invention.

What is claimed is:

1. A process of operating an industrial process control transmitter to compensate for errors in a representation of a process variable measurement, wherein the industrial process control transmitter includes first and second capacitive sensors that sense the process variable and a measurement circuit coupled to the sensors that provides the representation based on a ratio of the capacitances of the first and second sensors, and wherein the errors are due to leakage current in the sensors, the process comprising steps of:
   a) measuring a leakage conductance for each of the first and second sensors;
   b) measuring the capacitance ratio; and
   c) deriving a representation of a measurement of the process variable based on the measured capacitance ratio and leakage conductances.

2. The process of claim 1, wherein step (c) comprises steps of:
   c1) identifying a capacitance deviation for each of the first and second sensors based on the measured leakage conductance,
   c2) deriving a first error expression based on a first ratio of the capacitance deviations of the first and second sensors and the capacitances of the first and second sensors,
   c3) deriving a second error expression based on a second ratio of the capacitance deviations of the first and second sensors and the capacitances of the first and second sensors, and
   c4) deriving the representation of the process variable measurement based on the measured capacitance ratio and the first and second error expressions.

3. The process of claim 2, wherein the industrial process control transmitter includes a charge circuit for supplying an input voltage to the first and second sensors so that the first and second sensors supply charges to the measurement circuit, and the measurement circuit integrates the charges to derive the process variable measurement, wherein step (c1) comprises steps of:
   c1a) calculating a capacitance deviation, $\delta C_H$, for the first sensor based on the expression $$G_H \tau \frac{V_P}{V_{ex}},$$

where $V_{ex}$ is an excitation voltage, $V_P$ is a first input voltage, $G_H$ is a leakage conductance of the first sensor and $\tau$ is the time of integration, and c1b) calculating a capacitance deviation, $\delta C_L$, for the second sensor based on the expression $$G_L \tau \frac{V_N}{V_{ex}},$$

where $V_N$ is a second input voltage and $G_L$ is a leakage conductance of the second sensor.

4. The process of step 3, wherein step (c1) further comprises steps of:
   c1c) storing a table of capacitance deviations values based on values of variables selected from the group consisting of conductance and integration time,
   c1d) measuring a value of the variable for the table, and
   c1e) selecting $\delta C_H$ and $\delta C_L$ from the table based on the measured value.

5. The process of claim 2, wherein step (c2) comprises: calculating $$\varepsilon_1 = \eta_m \frac{\delta C_H + \delta C_L}{C_H + C_L},$$

where $\eta_m$ is the measured capacitance ratio, $\delta C_H$ and $\delta C_L$ are the capacitance deviations of the first and second sensors, and $C_H+C_L$ is the sum of the capacitance of the first and second sensors.

6. The process of claim 5, wherein step (c3) comprises: calculating $$\varepsilon_2 = \frac{\delta C_H - \delta C_L}{C_H + C_L}.$$

7. The process of claim 6, wherein step (c4) comprises: calculating $\eta_m+\epsilon_1-\epsilon_2$.

8. The process of claim 2, wherein step (c3) comprises: calculating $$\varepsilon_2 = \frac{\delta C_H - \delta C_L}{C_H + C_L},$$

where $\eta_m$ is the measured capacitance ratio, $\delta C_H$ and $\delta C_L$ are the capacitance deviations of the first and second sensors, and $C_H + C_L$ is the sum of the capacitance of the first and second sensors.

9. The process of claim 2, wherein the industrial process control transmitter includes a charge circuit for supplying an input voltage to the first and second sensors so that the first and second sensors supply charges to the measurement circuit, and the measurement circuit integrates the charges to derive the process variable measurement, and wherein the first sensor comprises a first principal capacitive sensor for sensing the process variable and a first offset capacitor for sensing the process variable in a manner that is the same as that of the first principal capacitive sensor, the first offset capacitor having a capacitance based on an offset of the first principal capacitive sensor, and the second sensor comprises a second principal capacitive sensor for sensing the process variable in a manner different from that of the first principal capacitive sensor and a second offset capacitor for sensing the process variable in a manner that is the same as that of the second principal capacitive sensor, the second offset capacitor having a capacitance based on an offset of the second principal capacitive sensor, wherein steps (c2) and (c3) comprise steps of:
calculating $$\tilde{\varepsilon}_1 = \tilde{\eta}_m \frac{\delta \tilde{C}_H + \delta \tilde{C}_L}{\tilde{C}_H + \tilde{C}_L},$$

where $\eta_m$ is the measured capacitance ratio, $\delta \tilde{C}_H$ and $\delta \tilde{C}_L$ are the capacitance deviations of the first and second sensors, and $\tilde{C}_H + \tilde{C}_L$ is the estimated total capacitance of the first and second sensors, and
calculating $$\tilde{\varepsilon}_2 = \frac{\delta \tilde{C}_H + \delta \tilde{C}_L}{\tilde{C}_H + \tilde{C}_L}.$$

10. The process of claim 9, wherein step (c4) comprises: calculating $\eta_m + \epsilon_1 - \epsilon_2$.

11. The process of claim 9, wherein step (c1) comprises steps of:

c1a) calculating a capacitance deviation, $\delta \tilde{C}_H$, for the first sensor based on the expression $$(1 - k_H \beta_H) G_H \tau \frac{V_P}{V_{ex}},$$

where $k_H$ is a gain factor associated with the first offset capacitor, $\beta_H$ is a ratio of leakage conductances $G_{HR}/G_H$, $V_P$ is a first input voltage, $V_{ex}$ is an excitation voltage, $G_H$ is the leakage conductance of the first principal capacitive sensor, $G_{HR}$ is the leakage conductance of the first offset capacitor and $\tau$ is the time of integration, and c1b) calculating a capacitance deviation, $\delta \tilde{C}_L$, for the second sensor based on the expression $$(1 - k_L \beta_L) G_L \tau \frac{V_N}{V_{ex}},$$

where $k_L$ is a gain factor associated with the second offset capacitor, $\beta_L$ is a ratio of leakage conductances $G_{LR}/G_L$, $V_N$ is a second input voltage, $G_L$ is the leakage conductance of the second principal capacitive sensor and $G_{LR}$ is the leakage conductance of the second offset capacitor.

12. The process of step 11, wherein step (c1) further comprises steps of:

c1c) storing a table of capacitance deviations values based on values of variables selected from the group consisting of conductance and integration time, c1d) measuring a value of the variable for the table, and c1e) selecting $\delta \tilde{C}_H$ and $\delta \tilde{C}_L$ from the table based on the measured value.

13. An industrial process control transmitter having first and second capacitive sensors that sense a process variable and a measurement circuit coupled to the sensors, the measurement circuit for measuring the capacitances of the first and second sensors, the measurement circuit including a processor programmed to:

a) identify a ratio of the capacitances of the first and second sensors;

b) identify a capacitance deviation for each of the first and second sensors based on a leakage conductance of the respective sensor; and c) calculate a representation of a measurement of the process variable based on the capacitance ratio and the capacitance deviations.

14. The industrial process control transmitter of claim 13, wherein the processor is further programmed to:

c1) derive a first error expression based on the identified capacitance ratio and a ratio of the capacitance deviations of the first and second sensors and the capacitances of the first and second sensors, c2) derive a second error expression based on a ratio of the capacitance deviations of the first and second sensors and the capacitances of the first and second sensors, and c3) derive the representation of the process variable measurement based on the identified capacitance ratio and the first and second error expressions, to thereby execute program step (c).

15. The industrial process control transmitter of claim 13, further including a charge circuit for supplying an input voltage to the first and second sensors so that the first and second sensors supply charges to the measurement circuit, wherein the measurement circuit integrates the charges to derive the process variable measurement, wherein the processor includes a look-up table identifying capacitance deviations as a function of at least one variable selected from the group consisting of leakage conductance, G, of a sensor and integration time, $\tau$, of the measurement circuit, the look-up table being generated by:

d) calculating, for each variable, a set of capacitance deviations, $\delta C$, based on an expression $$G_\tau \frac{V}{V_{ex}},$$

where $V$ and $V_{ex}$ are voltages to the sensor.

16. The industrial process control transmitter of claim 13, wherein the processor includes a look-up table identifying capacitance deviations as a function of at least one variable selected from the group consisting of leakage conductance, G, of a sensor and integration time, τ, of the measurement circuit, and the processor is further programmed to:

b1) measure the variable for each sensor,
b2) select a capacitance deviation value from the look-up table for each of the first and second sensors based on the measured variable, to thereby execute program step (b).

17. The industrial process control transmitter of claim 14, wherein the processor is further programmed to:

calculate $$\varepsilon_1 = \eta_m \frac{\delta C_H + \delta C_L}{C_H + C_L},$$

where $\eta_m$ is the identified capacitance ratio, $\delta C_H + \delta C_L$ is the sum of the deviation capacitances, and $C_H + C_L$ is the sum of the capacitances of the first and second sensors, to thereby execute program step (c1).

18. The industrial process control transmitter of claim 17, wherein the processor is further programmed to:

calculate $$\varepsilon_2 = \frac{\delta C_H - \delta C_L}{C_H + C_L},$$

to thereby execute program step (c2).

19. The industrial process control transmitter of claim 18, wherein the processor is further programmed to:

calculate $\eta_m + \varepsilon_1 - \varepsilon_2$, to thereby execute program step (d4).

20. The industrial process control transmitter of claim 14, further including a charge circuit for supplying an input voltage to the first and second sensors so that the first and second sensors supply charges to the measurement circuit, and the measurement circuit integrates the charges to derive the process variable measurement, and wherein the first sensor comprises a first principal capacitive sensor for sensing the process variable and a first offset capacitor for sensing the process variable in a manner that is the same as that of the first principal capacitive sensor, the first offset capacitor having a capacitance based on an offset of the first principal capacitive sensor, and the second sensor comprises a second principal capacitive sensor for sensing the process variable in a manner different from that of the first principal capacitive sensor and a second offset capacitor for sensing the process variable in a manner that is the same as that of the second principal capacitive sensor, the second offset capacitor having a capacitance based on an offset of the second principal capacitive sensor, wherein the processor is further programmed to:

calculate $$\tilde{\varepsilon}_1 = \tilde{\eta}_m \frac{\delta \tilde{C}_H - \delta \tilde{C}_L}{\tilde{C}_H + \tilde{C}_L},$$

where $\tilde{\eta}_m$ is the identified capacitance ratio, $\delta \tilde{C}_H$ and $\delta \tilde{C}_L$ are the capacitance deviations of the first and second sensors, and $\tilde{C}_H + \tilde{C}_L$ is the estimated total capacitance of the first and second sensors, and calculate $$\tilde{\varepsilon}_2 = \frac{\delta \tilde{C}_H - \delta \tilde{C}_L}{\tilde{C}_H + \tilde{C}_L},$$

to thereby execute program steps (c1) and (c2).

21. The industrial process control transmitter of claim 20, wherein the processor is further programmed to:

calculate $\eta_m + \varepsilon_1 - \varepsilon_2$, to thereby execute program step (c3).

* * * * *